United States Patent [19]

Bevers et al.

[11] Patent Number: 4,852,145
[45] Date of Patent: Jul. 25, 1989

[54] TELEPHONE SUBSCRIBER LOOP TEST SYSTEM

[75] Inventors: Morey S. Bevers, Naperville; Michael G. Amaro, Schaumburg; Robert A. Musson, Wheeling, all of Ill.

[73] Assignee: Teradyne, Inc., Boston, Mass.

[21] Appl. No.: 223,435

[22] Filed: Jul. 22, 1988

[51] Int. Cl.$^4$ .................. H04M 1/24; H04B 3/46
[52] U.S. Cl. .................................. 379/27; 379/30; 379/29
[58] Field of Search ............... 379/30, 29, 26–27

[56] References Cited

U.S. PATENT DOCUMENTS

| | | | |
|---|---|---|---|
| 4,113,998 | 9/1978 | Ashdown et al. | 179/175.3 R |
| 4,139,745 | 2/1979 | Ashdown et al. | 179/175.3 F |
| 4,373,121 | 2/1983 | Sartori et al. | 179/175.3 F |
| 4,396,809 | 8/1983 | Brunssen | 179/175.3 F |
| 4,438,299 | 3/1984 | Tomin | 179/175.3 F |
| 4,626,632 | 2/1986 | Mazz | 379/29 |

Primary Examiner—Stafford D. Schreyer

[57] ABSTRACT

A method of locating faults in a telephone system including the steps of connecting antiparallel rectifying switches (ARS's) that inhibit alternating current (A.C.) flow in one direction but not the other between subscriber equipment and respective telephone company lines, applying an A.C. test signal to a telephone company line and measuring a resulting signal, and determining whether a fault is on the telephone company line or customer equipment based upon the resulting signal. Also disclosed is an ARS that includes a first input and output, a second input and output, and paths between respective inputs and outputs providing low turn-on thresholds in one direction between respective inputs and outputs and high turn-on thresholds in the other direction, the directions of low and high being the same for both sets of inputs and outputs.

33 Claims, 6 Drawing Sheets

ASSYMMETRIC SWITCH
CHARACTERISTIC CURVE

TELEPHONE SUBSCRIBER LOOP TEST SYSTEM

FIELD OF THE INVENTION

This invention relates to automatic telephone subscriber loop testing systems which are used to locate faults in telephone equipment.

BACKGROUND OF THE INVENTION

With deregulation, telephone company customers have been able to purchase telephone equipment from a variety of sources This telephone equipment could be a single telephone or a private branch exchange (PBX) or other telephone switching system for a large corporation. The local telephone companies, however, are not required to service any subscriber-owned equipment purchased from a supplier other than the telephone company itself Consequently, when a service problem arises, the local telephone company would like to be able to determine, without the expense of a trip to the subscriber's site, whether or not the problem is caused by the telephone company's equipment and lines or by the subscriber-owned equipment.

To this end, telephone companies employ an automated subscriber loop test system, located at the central office, and remote isolation devices (RID's) connected between the telephone company's lines and the subscribers' equipment. RID's are used to momentarily isolate the subscribers'equipment from the telephone company's lines during testing by the automated loop tester to determine the source of a problem. This testing may also be done as part of a periodic, general testing of all telephone lines. An automated subscriber loop tester is described in Ashdown et al. U. S. Pat. No. 4,139,745 ("'745 patent") and Ashdown et al U.S. Pat. No. 4,113,998 ("'998 patent"), which are hereby incorporated by reference, and is commercially available from Teradyne, Inc. under the 4TEL trade designation. Other automated subscriber loop testers are commercially available from other sources. A typical testing sequence includes doing direct current (D.C.) and alternating current (A.C.) measurements, e.g., as described at col. 2, lines 25 to 45 of the '998 patent The results of the test sequence include a "fault value" (in ohms), a "type of fault" identification (e.g., a "short" between the tip and ring lines of the same telephone line, a "cross" connection of one telephone line to an adjacent line, or a "ground" connection to the tip or ring line), and an indication of whether there is a remote isolation device (RID) and, if so, the type of device. If an RID is detected, a further series of D.C. and A.C. measurements is performed in order to "segment the fault", identifying it as either a telephone company fault or a subscriber fault.

Prior remote isolation devices presently in use include voltage sensitive switch (VSS) type devices that block D.C. test signals below their thresholds and pass D.C. signals above their thresholds and pulse-activated devices that provide a high impedance open to the test system's signals after an activation pulse has been applied.

SUMMARY OF THE INVENTION

In one aspect our invention features locating faults on a telephone system by connecting an antiparallel rectifying switch (ARS) that inhibits alternating current (A.C.) flow in one direction between the telephone company line and subscriber equipment, applying an A.C. test signal to a telephone line and measuring the resulting signal, and determining whether a fault is on the telephone company line or in the equipment based upon the resulting signal. Using this method, one can employ the results of a first line test already employed to obtain fault type and value to segment a fault as either a subscriber equipment fault or a telephone company fault without doing a second line test.

In preferred embodiments the resulting signal is used to determine A.C. measured conductance, and there also is a D.C. test signal and measurement of D.C. resistance, and the A.C. measured conductance and D.C. measured resistance are compared to segment the fault; the ARS device has a threshold in one direction that is higher than that in the other direction, and the applied A.C. test signal is below the higher threshold to cause a rectified resulting signal; the interface device can function as an isolation device by comparing signals provided below and above the higher threshold; the system employs rectification to segment cross faults, and ground faults, blocking to segment short faults, and isolation in cases where segmentation cannot be determined by rectification, for example, complex multiple faults. The system performs a first series of measurements (including A.C. and D.C. measurements and a determination of fault type and value), and determines if there is any remote isolation device (whether an antiparallel rectifying switch, i.e. one that inhibits A.C. flow in one direction, or another type of RID), and, if not, displays a dispatch statement without an indication of segmentation. If a remote isolation device has been detected, the system determines whether there is a pulse activated type RID, and, if so, provides a pulse to disconnect the RID and performs a second series of measurements in order to segment the fault. If the RID is not a pulse activated type, the system determines whether the RID is an antiparallel rectifying switch (ARS) and whether the fault is a ground, cross, or short and, if both conditions are met, determines segmentation based upon the results of the first series of measurements. If both conditions are not met, and if the fault is capable of being segmented with the type of RID present, a second series of measurements is performed in a manner to provide isolation, and the fault is segmented.

In another aspect our invention features an ARS that is located between a telephone company line and subscriber equipment and has first and second inputs and outputs (i.e., for ring and tip) and paths between respective inputs and outputs providing low turn-on thresholds in one direction and high turn-on thresholds in the other direction, the direction of low and high being the same for both sets of inputs and outputs. By employing asymmetrical thresholds in the ARS, only one threshold level need be achieved to conduct current through both lines, unlike the need to meet two thresholds in existing RID's having symmetrical thresholds. Such an arrangement permits accurate characterization of certain fault situations that might otherwise go undetected or be mischaracterized, e.g., subscriber side shorts (i.e., ring to tip) and multiple faults.

In preferred embodiments each path between respective inputs and outputs includes a high turn-on threshold path for current flow in one direction and a low turn-on threshold path for current flow in the other direction; the low turn-on threshold path includes a diode; the high turn-on threshold path includes one of the group of a silicon controlled rectifier (SCR) or functional equivalent, a diac, a triac, a silicon unilateral switch, a silicon bilateral switch or other four-layer devices; most preferably an SCR is used, and there is a zener diode connected to the gate of the SCR to control the turn-on threshold; and there are resistors and capacitors to suppress transient signals to prevent premature firing of the SCR. There is a signature circuit including a zener diode, a resistor, and a diode to provide a polarized impedance between the inputs of the ARS. By placing the signature circuit between the inputs, it is not dependent upon the voltage sensitive nature of the paths between inputs and outputs. Also, the zener diode causes the signature to "disappear" when test signals are below the zener threshold, facilitating identification.

Other advantages and features of the invention will be apparent from the following description of a preferred embodiment thereof and from the claims.

DESCRIPTION OF THE PREFERRED EMBODIMENT

The preferred embodiment will now be described.

Drawings

FIG. 4 is a flow chart of a method employed by

Structure

Figure 1:
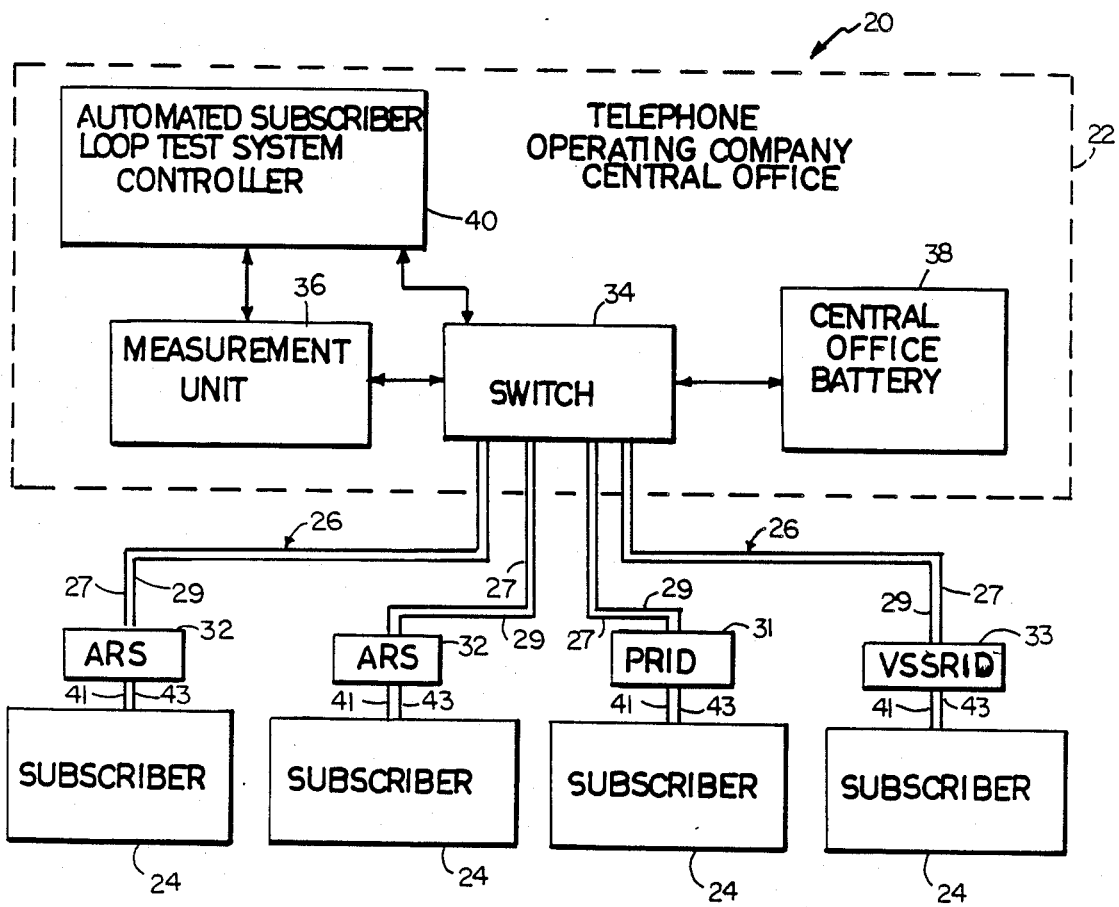
FIG. 1 is a block diagram showing a telephone testing system employing the method of the invention and having ARS's according to the invention.

Referring to FIG. 1, telephone system 20 includes central office equipment 22, which is connected to remote subscriber telephone equipment 24 via telephone company lines 26. Remote subscriber telephone equipment 24 may include a single telephone such as in a residential application or multiple telephones connected via a switching system (e.g., a PBX) such as in a business application. Each telephone line 26 includes a tip line 27 and a ring line 29. Antiparallel rectifying switch (ARS) 32 is remotely connected between at least some telephone lines 26 and the associated subscriber equipment 24. ARS 32 is a particular type of remote isolation device (RID) that inhibits A.C. flow in one direction but not the other. Other types of RID's, e.g., pulse activated RID 31 and voltage sensitive switch RID 33 (the latter having the same turn-on thresholds in both directions), are used to connect telephone lines 26 to other subscriber equipment 24.

Central office equipment 22 includes switch 34 to connect telephone lines 26 to measurement unit 36 and central office battery 38. Measurement unit 36 is also connected to automated subscriber loop test system controller 40. These components are the same as and make the same measurements as the components that are presently used in commercially available telephone system testers and are described in the '745 and '998 patents. Controller 40 includes additional software to provide the added capabilities permitted via the use of ARS 32, as described below.

Figure 2:
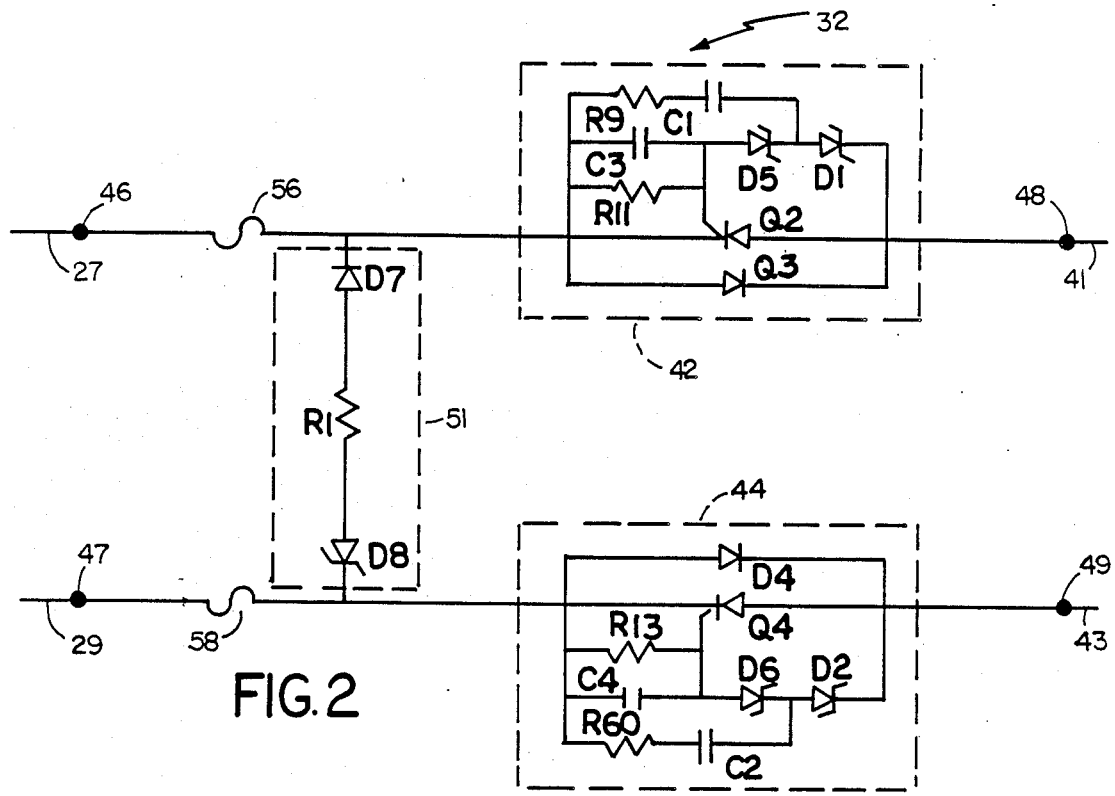
FIG. 2 is a schematic of a FIG. 1 ARS.

Referring to FIG. 2, ARS 32 is connected between tip and ring lines 27, 29 of telephone line 26 and tip and ring lines 41, 43 of subscriber equipment 24. ARS 32 includes two completely independent and isolated switching circuits 42, 44 located between tip input terminal 46 and tip output terminal 48 and ring input terminal 47 and ring output terminal 49, respectively. Signature circuit 51 is connected between tip input terminal 46 and ring input terminal 47.

Tip switch 42 includes silicon-controlled rectifier (SCR) Q2, diode D3, resistors R9 and R11, capacitors C1 and C3, and zener diodes D1 and D5. Ring switch 44 is identical, including SCR Q4, diode D4, resistors R10 and R12, capacitors C2 and C4, and zener diodes D2, D6. Signature circuit 51 includes diode D7, resistor R1, and zener diode D8 connected in series. The following is a list of values for the elements of the preferred embodiment:

| Resistors | Value (ohms) |
|---|---|
| R1 | 75K, ¼ W, 5% |
| R9, R10 | 470, ⅛ W, 10% |
| R11, R12 | 1.2M, ⅛ W, 5% |
| Diodes | Type |
| D1, D2 | 1N5235 6.8 V Zener |
| D3, D4, D7 | 1N4007 1000 V 1A |
| D5, D6, D8 | 1N5242 12 V Zener |
| Capacitors | Value |
| C1, C2 | 0.047 μf 50 V Ceramic |
| C3, C4 | 2200 pf 50 V Ceramic |

SCR Q2 is a sensitive gate SCR having a maximum holding current specification of 500 μA and a minimum holding current specification of 30 μA over its operating temperature range of −40° C. to +65° C.

Figure 3:
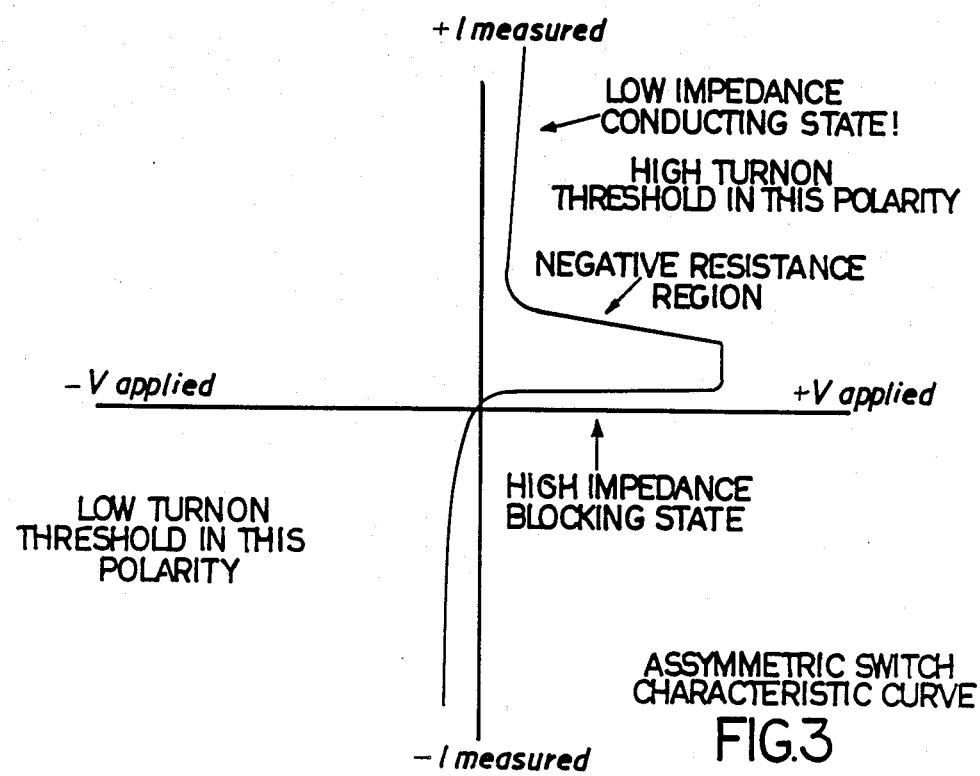
FIG. 3 shows a voltage versus current characteristic curve for group of a components used in the FIG. 2 ARS.

Tip switch 42 and ring switch 44 are each a group of components having the characteristics shown in FIG. 3 and described in detail below. (Other groups of components having the desired characteristics could be used.) Fuses 56, 58 are provided at inputs 46, 47; they are 250 V, 2.0 A time delay fuses.

Inasmuch as switches 42, 44 are identical, only the connections of switch 42 will be described in detail. The anode of diode D3 is connected to tip input terminal 46 via fuse 56; the cathode of diode D3 is connected to tip output terminal 48. The cathode of SCR Q2 is connected to tip input terminal 46 via fuse 56, and the anode is connected to tip output terminal 48. Resistor R11 and capacitor C3 are connected in parallel between the cathode of SCR Q2 and the gate of SCR Q2. Also connected to the gate of SCR Q2 is the anode of zener diode D5. Resistor R9 and capacitor C1 are connected in series between the cathode of SCR Q2 and the cathode of zener diode D5. The cathode of diode D5 is also connected to the anode of zener diode D1, the cathode of which is connected to terminal 48.

Operation

In general, when it is desired to test for faults with respect to a reported problem or as part of periodic general testing, the tip line 27 and ring line 29 for equipment 24 of a particular subscriber are connected via switch 34 to measurement unit 36 and battery 38 for testing under control of controller 40. The testing includes, but is not limited to, applying test signals of known voltage characteristics to the tip and ring line, and measuring the resulting current to calculate an impedance associated with a fault. The operation of ARS 32 will be described first, and the improved method of fault testing and the ability to handle particular fault situations will be described thereafter.

Antiparallel Rectifying Switch (ARS)

Referring to FIG. 2, ARS 32 includes two switches 42, 44 that have a low turn-on thresholds from inputs 46, 47 to outputs 48, 49 and high turn-on thresholds from outputs 48, 49 to inputs 46, 47. Because switches 42, 44 are identical, only switch 42 will be discussed in detail.

The main current carrying path through switch 42, for current passing from tip input terminal 46 to tip output terminal 48, is through diode D3, which has a low, 0.7-V turn-on threshold.

The main current carrying path for current flowing in the reverse direction, from output terminal 48 to input terminal 46, flows through SCR Q2. This path has a high turn-on threshold (about 20 V), owing to the interaction of SCR Q2 with combined zener diodes D1, D5. In order for SCR Q2 to turn-on and conduct current, there must be a positive referenced anode to cathode potential, and a minimal amount of current provided to its gate. On FIG. 3, turn-on involves going from the high impedance blocking state through the negative resistance region to the low impedance conducting state. Diodes D1 and D5 do not permit flow of current into the gate of SCR Q2 until the voltage across SCR Q2 exceeds their combined zener threshold, namely 20 V. A threshold of 20 V is employed because it is between the 10-V and 50-V D.C. test voltages, permitting use of the 50-V drive signal to see faults on the subscriber side and use of a 10-V drive signal to isolate the subscriber side. After being turned on, current will continue to be conducted through SCR Q2 so long as the flow provided it exceeds SCR Q2's holding current specification. While conducting current, SCR Q2 provides a low impedance path, the voltage drop being negligible compared to the fault being measured. If the current available is lower than SCR Q2's holding current requirement, SCR Q2 will switch back off to its nonconducting state. SCR Q2 has a maximum holding current specification of 500 $\mu$A and a minimum holding current specification of 30 $\mu$A. The 500 $\mu$A specification guarantees the latched condition for a 50-V drive and faults of 100 kohms or less. The 30 $\mu$A specification guarantees that SCR Q2 will be off at low current levels to guard against false pulsing of high impedance ringers. Between the 30 and 500 $\mu$A values, the SCR may or may not be on.

The remaining components of switch 42, namely the resistors and capacitors, act as transient suppression devices. Resistor R11 and capacitor C3 provide gate transient suppression. Their purpose is to pass short-term current surges around the gate so that SCR Q2 does not conduct. Parasitic capacitance in zener diodes D1, D5 can approach up to 100 pF each. This parasitic capacitance is capable of inducing current in the presence of a step voltage with a quick rise time. This suppression is of great importance when the line test system snaps in its 10-V drive, and the blocking state of SCR Q2 is desired to be maintained. Resistor R9 and capacitor C1 reduce any 60 Hz A.C. (the predominant power frequency) that has been induced on the telephone line, as discussed in detail in the '998 patent. If the induced voltage is high enough to allow zener diode D1 to breakover, a low impedance path around SCR Q2 through C1 and R9 is created, permitting circuit 42 to remain in its blocking state under A.C. power influence while the line test system has its 10-V drive signal on the line.

Signature circuit 51 is used to determine whether there is an ARS 32 on a particular telephone line 26. The signature circuit provides a polarized impedance of 100 kohms $\pm$10% that is provided by 75-kohm 5% resistor R1 and 12-V zener diode D8; under a 50-V drive condition, this combination presents 100 kohms resistance to the line test system. Because this signature is polarized, it is not confused with a 100-kohm short between the tip and ring lines. The polarization is oriented so that it is transparent to the normal telephone company battery. Zener diode D8 has a reverse breakdown voltage of 12 V $\pm$5%. The signature will thus be detected when applying a 50-V test signal of proper polarity (ring more positive than tip) and will "disappear" when a 10-V test signal is applied. This characteristic is not present in pulse activated remote isolation devices and permits ARS 32 to be distinguished from pulse activated remote isolation devices.

The placing of the signature circuit on the telephone company side of switches 42, 44 eliminates the voltage/current sensitive effects of these circuits on signature detection and provides more reliable signature detection. The voltage/current sensitive effects of switches 42, 44 could, in the presence of faults, impede presenting the signature impedance to the line test system. Proper identification of ARS 32 permits the line test system to avoid unnecessary tests.

Fuses 56, 58 are designed to blow at a continuous level that is above that used during testing and normal telephone operation but substantially below that resulting from a power cross (cross of the telephone line to a power line). Fuses 56, 58 are also designed to survive short term surges (35 peak Amperes 1000 peak volts with a 10 microsecond rise to peak value and 1000 microsecond decay to one half peak value) such as those attainable due to a far strike of lightning.

A further feature of ARS 32 is that it does not have the large 10 to 20 microfarad capacitance that many present voltage sensitive switch RID's have associated with their A.C. bypass paths that are around the VSS's and are needed for these RID's to operate. By removing this path and the associated capacitance, ARS 32 avoids the resulting interference of the terminating equipment ringer on network capacitance measurements used to determine length of line.

Fault Testing Method

Figure 4:
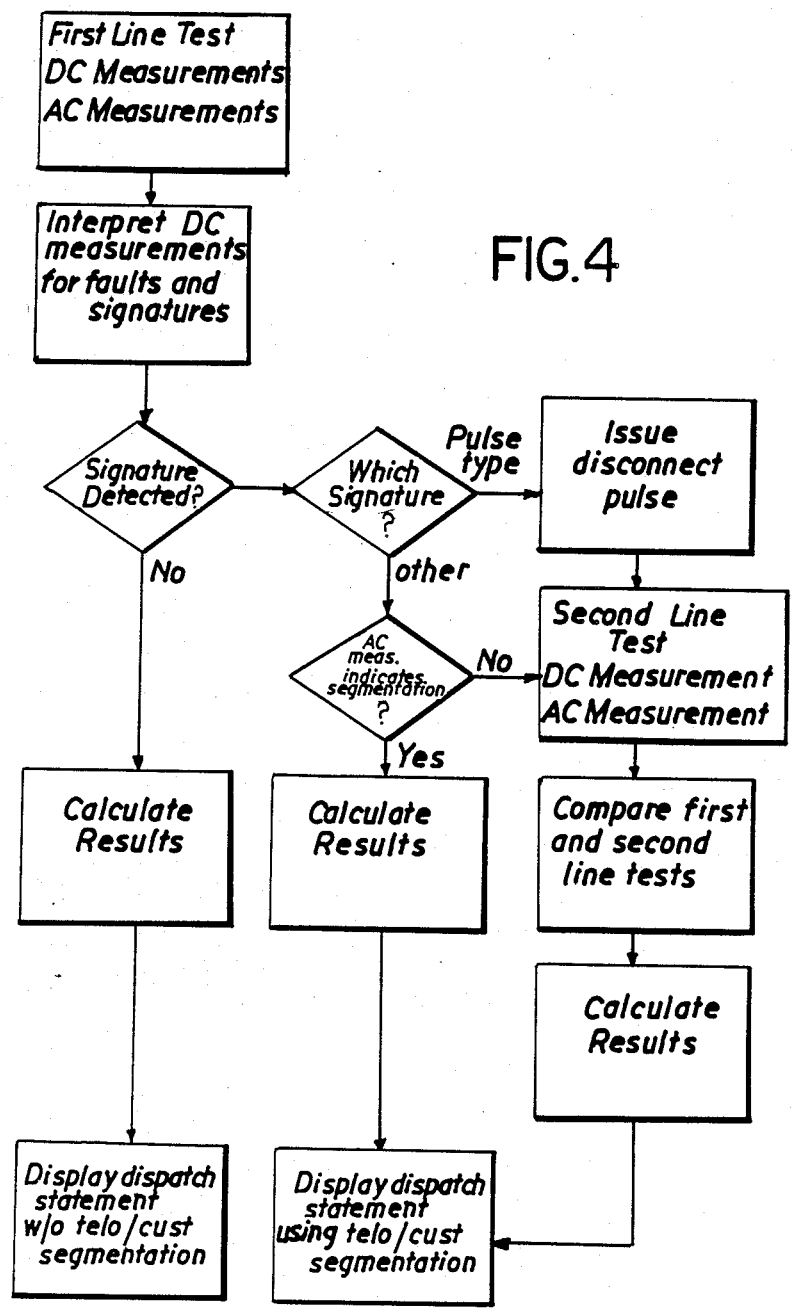

Turning now to the method of testing faults described in FIG. 4, controller 40 causes the D.C. and A.C. measurements to be made under various conditions and interprets the results of the measurements for faults and signatures, as is described in the '998 and '745 patents. The initial series of measurements, also referred to as a "line test", will indicate the type of fault (e.g., a tip ground, tip cross, tip-to-ring short, ring ground, ring cross) and value (e.g., 50 kohms). Also, as is described in more detail below, if there is a cross fault and an ARS has been detected, A.C. measurements are made in manner to prevent D.C. fault current from flowing.

If a signature is not detected (indicating absence of any type of remote isolation device, whether an ARS 32 or another type), the initial results are calculated and displayed in a dispatch statement (e.g., on a CRT or print-out) without any indication of whether the fault is a telephone company fault or a subscriber fault, as is indicated in the left flow column of FIG. 4.

If a signature is detected, the system determines whether it indicates a pulse-activated RID 31 or whether it indicates another type of device, e.g., an ARS 32 or a symmetrical VSS-type device 33.

If a pulse activated RID has been detected, the right flow column of FIG. 4 applies. A 130-V disconnect pulse is issued to the RID, and a second line test using D.C. measurements and A.C. measurements is performed (with subscriber equipment 24 isolated). The results are compared with the results of the first line test in order to segment telephone company and customer faults. An indication of segmentation is then included in a dispatch statement.

If other than a pulse activated RID signature has been detected, the middle flow column of FIG. 4 applies. Controller 40 determines whether the measurements already performed can be used to determine segmentation without the need for isolating the subscriber equipment and performing a second line test. Such a determination can be made if: (1) an ARS 32 has been detected by its unique signature, (2) the fault is a ground fault, cross fault or short fault, and (3) the A.C. measurements indicate that rectification or A.C. blocking has occurred. (Multiple faults need to be isolated by ARS 32 to be segmented.) If yes, controller 40 performs segmentation calculations based upon the results of the first line test as described in more detail hereinafter, and displays the results in the dispatch statement. If not, as in the case of VSS RID's, the right flow column applies once again, and there is a second line test in a manner in which subscriber equipment 24 is isolated, as just described.

Figure 5:
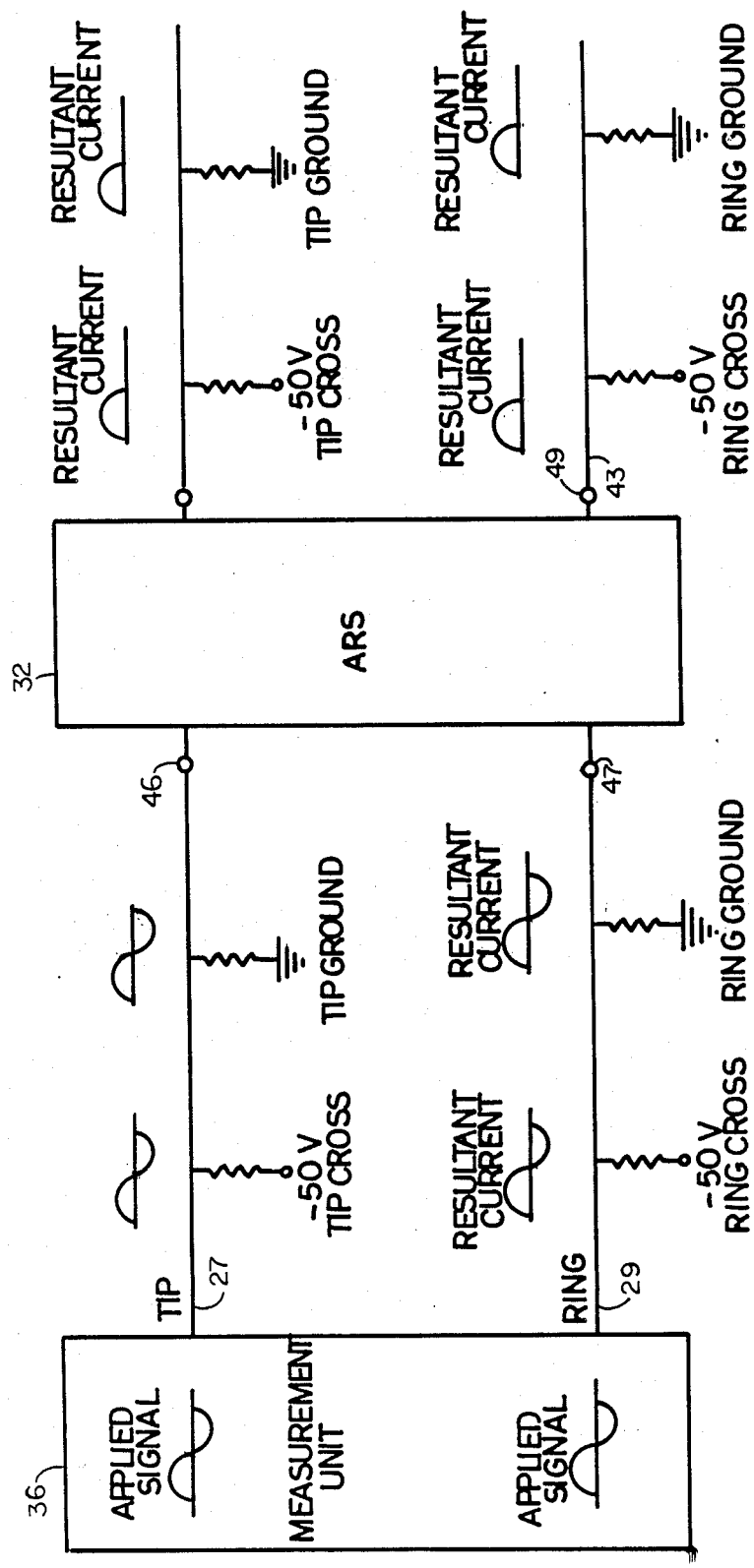
FIGS. 5 and 5A are diagrams illustrating a method of segmentation employing rectification and blocking.
Figure 5A:
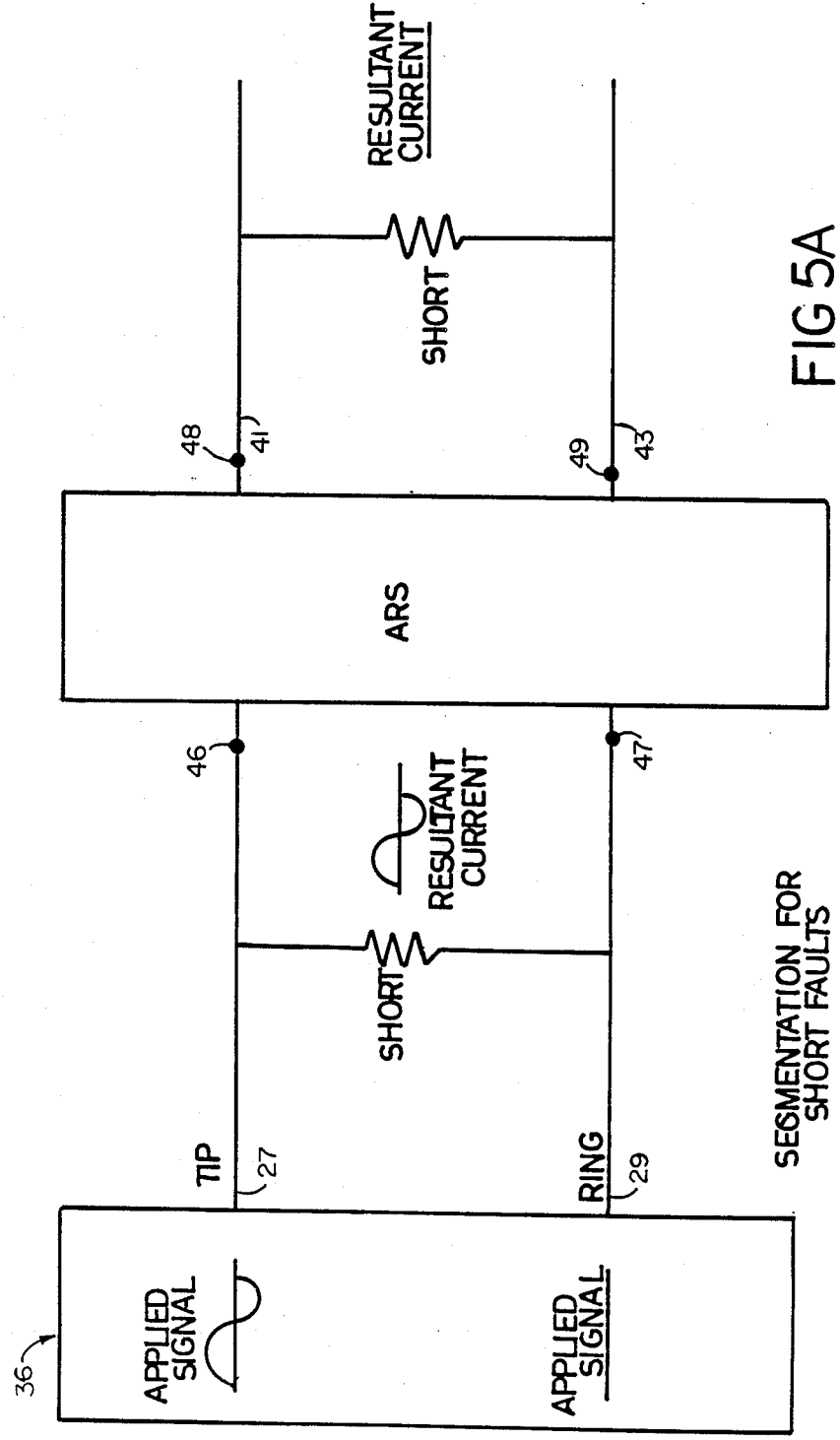

In segmenting the fault as either a telephone company fault or a subscriber fault based upon the of the first line test, the D.C. measured resistance is compared with the A.C. conductance measured. The A.C. drive signal is less than the 20-V turn-on thresholds of SCR Q2 and Q4. The D.C. measured resistance does not depend upon whether the fault is in telephone line 26 or subscriber equipment 24. The A.C. measured conductance depends upon whether the fault is in telephone line 26 or subscriber equipment 24; if the fault is in telephone line 26, the A.C. signal is not affected by ARS 32; if the fault is in subscriber equipment 24, the ARS will cause the A.C. signal to be half-wave rectified in the case of cross or ground faults, to be blocked in the case of subscriber short faults, to be unaffected by telephone company faults. The eight ground and cross fault situations for which the half-wave rectification effect is employed for segmentation and the associated signals resulting from the applied signals are indicated in FIG. 5 The two short fault situations for which the full-wave A.C. isolation effect is employed for segmentation and the associated signals resulting from the applied signals are indicated in FIG. 5A. The A.C. measurement result that is compared is one that corresponds to the D.C. measurement for the type of fault. E.g., if the D.C. measurements indicated a tip side ground fault, the A.C. measurement result used is that of tip side measurement.

The comparison employed by controller 40 is as follows: (1) for ground and cross faults, if the A.C. measured conductance is approximately one-half the inverse of the D.C. measured resistance, the fault is labeled a subscriber side fault; otherwise the fault is labeled a telephone company side fault, (2) for short faults, if the A.C. measured conductance is negligible with respect to the inverse of the D.C. measured resistance, the fault is labeled a subscriber side fault; otherwise the fault is labeled a telephone company side fault.

An advantage of the method of the invention over methods using symmetrical voltage sensitive switch RID's depending on isolation to provide segmentation is the ability to identify and segment cross faults on the subscriber side, e.g., a metallic fault to a ring line of an adjacent pair or a PBX signature; this is because such devices cannot isolate such faults. The segmentation of cross faults of the invention does not rely on isolation. When confronted with such a cross fault, the A.C. source is applied to the lines in a manner that prevents any D.C. component from flowing due to the cross fault. One way to block D.C. flow is through use of a filter; another way is matching the cross fault D.C. voltage with an equal D.C. voltage and superimposing an A.C. test signal. The ARS causes rectification of the A.C. signal if the cross or ground fault is on the subscriber side and no rectification if the cross or ground fault is on the telephone company side, permitting segmentation by the comparison described in the preceeding paragraph.

In the event of subscriber short faults, ARS 32 is used to block the A.C. test signal. Because the combined loop threshold is higher than the A.C. signal level, no A.C. signal is allowed to pass through the switches; hence segmentation can occur through the comparison of A.C. conductance to D.C. measured resistance. A.C. measurements are unaffected by telephone company side faults.

The isolation capability of ARS 32 also permits use of ARS 32 with older test systems requiring a two line test/two test voltage approach to segmentation. can also be used for redundancy checking of the A.C. segmentation and for multiple faults.

An advantage of the test system's automatic method is that it automatically detects if there is an ARS 32 present, and, if so, checks to see if rectification or blocking has occurred, and then performs segmentation without the need for a second line test, resulting in substantial savings in time and expense of testing. The automatic method also detects existing RID's that are not capable of rectification or A.C. blocking, and performs a second set of line measurements with the RID in its isolated state.

Short and Multiple Fault Characterization

Figure 6:
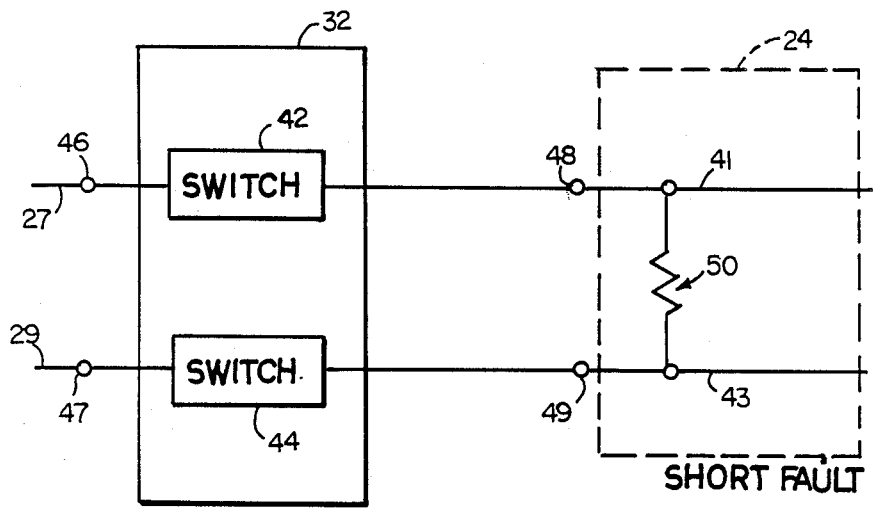
FIG. 6 is a diagram illustrating a subscriber side short fault situation.

The asymmetrical nature of switches 42, 44 permits accurate fault characterization of certain fault situations that might otherwise go undetected or be mischaracterized by present voltage sensitive switch RID s employing symmetrical thresholds. E.g., for subscriber side shorts, indicated by resistor 50 between tip and ring lines 41, 43 on FIG. 6, if switches 42, 44 have symmetrical thresholds, as in the case of VSS RIDs, two turn-on thresholds would have to be exceeded and two individual voltage/current relationships would have to be met for fault current to flow. The asymmetrical thresholds of circuits 42, 44 of this invention require that only one turn-on threshold be exceeded and that a single voltage/current relationship be met for fault current to flow, permitting subscriber side short faults to be accurately typed and the fault values for them to be precisely measured.

Figure 7:
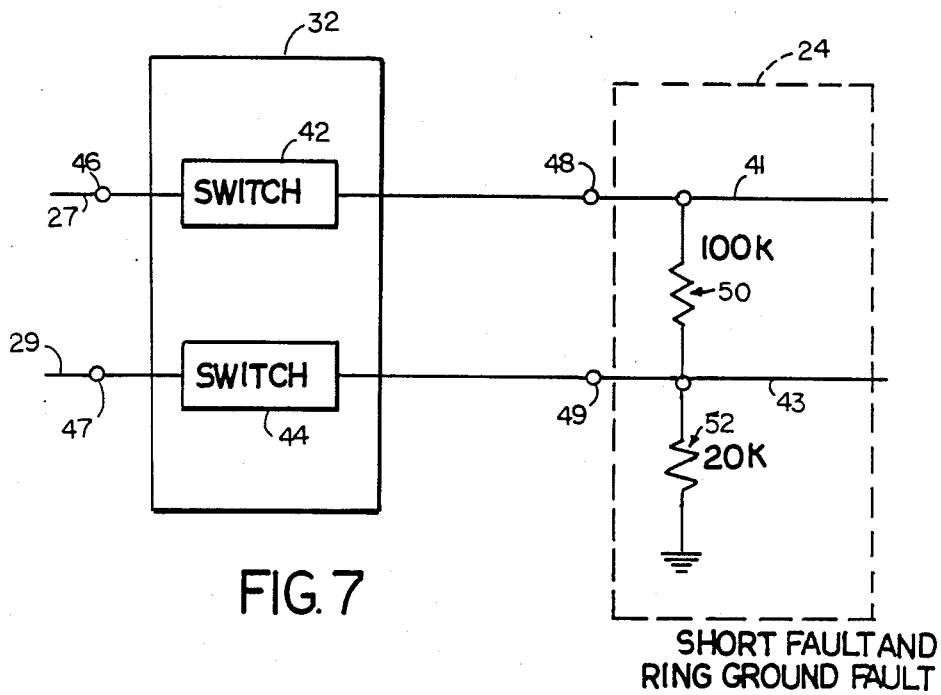
FIG. 7 is a diagram illustrating a subscriber side multiple fault situation.

Another fault situation that can present problems for fault typing and fault value measurements by symmetrical threshold devices such as VSS RID's are multiple faults. An example of such a multiple fault is shown in FIG. 7. This example assumes that the line test system uses a 50-V D.C. drive potential and that there is a 100-kohm subscriber-side short indicated by resistor 50 and 20-kohm subscriber-side ring-to-ground fault indicated by resistor 52. If the turn-on thresholds for switches 42, 44 are symmetrical at 20 V as in the case of VSS RID's, tip line 27 is driven with 50 V and ring line 29 is connected to ground; switch 44 will not turn on unless approximately 20 V is present between ring input 47 and ring output 49. This condition cannot occur because the voltage divider set up by the subscriber side faults leaves approximately 8.3 V across the ring side switch; the system would erroneously report a 20-kohm ring ground and a 120-kohm tip ground. When the asymmetrical thresholds of the invention are employed, the switch 44 needs only about 0.7 V to turn on, and the faults would be accurately typed and valued.

An advantage of being able to accurately type, segment, and measure faults is that the proper repair person for the type of fault will be dispatched, and he or she will be provided with more accurate and complete information, avoiding unnecessary trips and facilitating the repair work.

Other Embodiments

Other embodiments of the invention are within the scope of the following claims. E.g., in place of SCR Q2 and Q4 and their associated diodes, other voltage sensitive devices could be used, e.g., diacs, triacs, silicon unilateral switches, and silicon bilateral switches, and four-layer devices, also, the direction of high turn-on threshold and low turn-on threshold could be reversed, as long as the direction of high and low were the same for both switches 42, 44.

What is claimed is:

1. A method of locating faults in a telephone system comprising
    connecting remote isolation devices between subscriber equipment and respective telephone company lines of a telephone company network, at least some of said remote isolation devices being antiparallel rectifying switches (ARS's) that inhibit alternating current (A.C.) flow in one direction but not the other,
    applying an A.C. test signal to a said telephone company line that has been connected to a said ARS and measuring a resulting signal, the condition of said resulting signal being different if there is a fault on said telephone company line than if there is a fault in the associated subscriber equipment, and
    determining whether a fault is on said telephone company line or subscriber equipment based upon said resulting signal.

2. The method of claim 1 wherein said measuring a resulting signal results in an A.C. measured conductance, and further comprising, prior to said determining, applying a D.C. test signal to said telephone company line and measuring a D.C. resistance of said telephone company line, and wherein said determining includes comparing the A.C. measured conductance and D.C. measured resistance.

3. The method of claim 1 wherein said ARS has a turn-on threshold in one direction that is higher than that in the other direction, and the applied A.C. test signal is below the higher turn-on threshold and above the lower turn on threshold, causing a rectified resulting signal when the fault is in the subscriber's equipment and is either a cross or ground fault, causing a blocked resulting signal when the fault is in the subscriber's equipment and is a tip-to-ring short, and causing an unrectified resulting signal when the fault is in the telephone company line.

4. The method of claim 1 wherein the telephone lines include tip and ring lines, the ARS provides separate paths through it for the tip and ring lines, and each said path through the ARS for the tip and ring lines has a high turn-on threshold in one direction and a low turn-on threshold in the other direction.

5. The method of claim 2 wherein said faults are one or more of the group of cross faults, ground faults, and tip to ring shorts.

6. The method of claim 1 further comprising, prior to said connecting, selecting a said telephone company line for testing, and further comprising, after said applying, determining whether there is a remote isolation device other than an ARS on the selected telephone company line, and, if so, obtaining test results in the isolated and unisolated conditions of the remote isolation device in order to determine whether the fault is on said telephone company line or subscriber equipment.

7. The method of claim 1 wherein said applying is a part of a first series of measurements, and further comprising, prior to said connecting, selecting a said telephone company line for testing, and further comprising, after said applying, determining from the first series of measurements whether or not a fault segmentation determination can be made, and, if not, obtaining additional test results with the anti-parallel rectifying switch in its isolated condition in order to determine whether the fault is on said telephone company line or subscriber equipment.

8. The method of claim 4 wherein said ARS includes a signature circuit including a diode, a resistor and a zener diode in series between the tip and ring inputs, and wherein said applying is part of a first series of measurements including testing that indicates the presence of said signature circuit, and further comprising, prior to said connecting, selecting a said telephone company line for testing.

9. The method of claim 1 wherein said applying is part of a first series of measurements including testing that indicates the presence of one of many types of remote isolation devices and further discriminates the type of remote isolation device present on the telephone company line, and further comprising selecting a said telephone company line for testing, determining whether there is a remote isolation device present on the telephone company line, and determining which type of remote isolation device is present, and where indicated perform any additional test measurements necessary, and/or displaying a dispatch statement which may include telephone company or subscriber repair responsibility based on the presence of a remote isolation device on said telephone company line.

10. The method of claim 1 wherein said applying is part of a first series of measurements including testing that indicates the presence of one of many types of remote isolation devices and further discriminates the type of remote isolation device present on the telephone company line, and further comprising selecting a said telephone company line for testing, determining whether there is a remote isolation device present on the telephone company line, and determining which type of remote isolation device is present, and if there is an anti-parallel rectifying switch present on the selected telephone company line, performing no additional measurements and proceeding to said determining whether a fault is on said telephone company line or subscriber equipment and thereafter displaying a dispatch statement with telephone company or subscriber repair responsibility information.

11. The method of claim 1 wherein said applying is part of a first series of measurements including testing that indicates the presence of one of many types of remote isolation devices and further discriminates the type of remote isolation device present on the telephone company line, and further comprising selecting a said telephone company line for testing, determining whether there is a remote isolation device present on the telephone company line, and determining which type of remote isolation device is present, and, if there is a voltage sensitive switch (VSS) type remote isolation device that has the same turn-on thresholds in both directions on the selected line, performing an additional series of measurements with said VSS type remote isolation device in the isolated condition, and displaying a dispatch statement with telephone company or subscriber repair responsibility information.

12. The method of claim 1 wherein said applying is part of a first series of measurements including testing that indicates the presence of one of many types of remote isolation devices and further discriminates the type of remote isolation device present on the telephone company line, and further comprising selecting a said telephone company line for testing, determining whether there is a remote isolation device present on the telephone company line, determining which type of remote isolation device is present, and, if there is a pulse activated type remote isolation device on the selected line, applying a disconnect pulse, and performing an additional series of measurements with the pulse activated type remote isolation device in the isolated condition, and displaying a dispatch statement with telephone company or subscriber repair responsibility information.

13. The method of claim 1 wherein said applying is part of a first series of measurements including testing that indicates the presence of one of many types of remote isolation devices and further discriminates the type of remote isolation device present on the telephone company line, and further comprising selecting a said telephone company line for testing, determining whether there is a remote isolation device present on the telephone company line, and determining which type of remote isolation device is present, and if there is no remote isolation device present on the selected line, performing no additional measurements, and displaying a dispatch statement without telephone company or subscriber repair responsibility information.

14. An antiparallel rectifying switch (ARS) for connecting between a telephone company line and subscriber equipment for locating faults comprising
a first input and output,
a second input and output, and
paths between respective inputs and outputs providing low turn on thresholds in one direction between respective inputs and outputs and high turn-on thresholds in the other direction, the directions of low and high being the same for both sets of inputs and outputs.

15. The device of claim 14 wherein each path between the respective input and output includes a path with a high turn-on threshold path for current flow in one direction and a separate low turn-on threshold path for current flow in the other direction.

16. The device of claim 14 wherein said low turn-on threshold path that includes a diode.

17. The device of claim 15 wherein said high turn on threshold path includes one of the group of a silicon controlled rectifier, a diac, a triac, a silicon unilateral switch, a silicon bilateral switch or other four-layer devices.

18. The device of claim 15 wherein each high turn-on threshold path comprises a silicon controlled rectifier, and further comprising a zener diode connected to the gate of the silicon controlled rectifier so as to control the turn-on threshold for said path.

19. The device of claim 18 wherein said device also has capacitors and resistors to suppress transient signals.

20. The device of claim 18 wherein one set of capacitors and resistors is connected to pass short-term current surges around the gate, and another set of capacitors and resistors is used to reduce A.C. induced at the predominant power frequency.

21. The device of claim 14 wherein there is a signature circuit provided between the input terminals.

22. The device of claim 21 wherein said signature circuit provides a polarity that is transparent to the telephone company battery potential.

23. The device of claim 21 wherein said signature circuit includes a resistor, a zener diode, and a diode, connected in series.

24. Apparatus for locating faults in a telephone system comprising
remote isolation devices between subscriber equipment and respective telephone company lines of a telephone company network, at least some of said remote isolation devices being antiparallel rectifying switches (ARS's) that inhibit alternating current (A.C.) flow in one direction but not the other,
measurement means for applying an A.C. test signal to a said telephone company line that has been connected to a said ARS and for measuring a resulting signal, the condition of said resulting signal being different if there is a fault on said telephone company line than if there is a fault in the associated subscriber equipment, and
processor means for determining whether a fault is on said telephone company line or subscriber equipment based upon said resulting signal.

25. The apparatus of claim 24 wherein said measuring of a resulting signal results in an A.C. measured conductance, and wherein said measurement means includes means for applying a D.C. test signal to said telephone company line and measuring a D.C. resistance of said telephone company line, and wherein said processor means includes means for comparing the A.C. measured conductance and D.C. measured resistance.

26. The apparatus of claim 24 wherein said anti-parallel rectifying switch has a turn-on threshold in one direction that is higher than that in the other direction, and the applied A.C. test signal is below the higher turn-on threshold and above the lower turn-on threshold, causing a rectified resulting signal when the fault is in the subscriber's equipment and is either a cross or ground fault, causing a blocked resulting signal when the fault is in the subscriber's equipment and is a tip to-ring short, and causing an unrectified resulting signal when the fault is in the telephone company line.

27. The apparatus of claim 24 wherein the telephone lines include tip and ring lines, the ARS has separate paths through it for the tip and ring lines, and each said path through the ARS for the tip and ring lines has a high turn-on threshold in one direction and a low turn-on threshold in the other direction.

28. The apparatus of claim 25 wherein said faults are one or more of a group of cross faults, ground faults, or tip-to-ring shorts.

29. The apparatus of claim 24 wherein said processor means further comprises means for selecting a said telephone company line for testing and for determining whether there is a remote isolation device other than an ARS on the selected telephone company line, and, if so, obtaining test results in the isolated and unisolated conditions of the remote isolation device in order to determine whether the fault is on said telephone company line or subscriber equipment.

30. The apparatus of claim 24 wherein said measurement means comprises means for applying said A.C. test signal as part of a first series of measurements, and wherein said processor means comprises means for determining from the first series of measurements whether or not a fault segmentation determination can be made, and, if not, obtaining test results with the anti-parallel rectifying switch in the isolated condition in order to determine whether the fault is on said telephone company line or subscriber equipment.

31. The apparatus of claim 27 wherein said ARS includes a signature circuit including a resistor and a zener diode in series between the tip and ring inputs, and wherein said measurement means comprises means for applying said A.C. test signal as part of a first series of measurements including testing that indicates the presence of said signature circuit.

32. The apparatus of claim 24 wherein said measurement means includes means for applying an A.C. test signal to measure the tip-to-ring conductance of the telephone company line, and wherein said processor means comprises means for calculating an approximate cable length as a result of the tip-to-ring conductance measurements, and further comprising means for displaying said approximate cable length in a dispatch report.

33. The device of claim 14 wherein both said paths have a low turn-on threshold between the input and the output, and a high turn-on threshold between the output and the input, and wherein the combined loop threshold is higher than the A.C. signal level, thereby providing A.C. isolation of subscriber side tip-to-ring conductances, resulting in highly improved cable length measurements.

* * * * *